US010038008B1

United States Patent
Hopkins et al.

(10) Patent No.: US 10,038,008 B1
(45) Date of Patent: Jul. 31, 2018

(54) INTEGRATED STRUCTURES AND NAND MEMORY ARRAYS

(71) Applicant: Micron Technology, Inc., Boise, ID (US)

(72) Inventors: John D. Hopkins, Meridian, ID (US); David Daycock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/419,813

(22) Filed: Jan. 30, 2017

(51) Int. Cl.
| H01L 29/792 | (2006.01) |
| H01L 27/11582 | (2017.01) |
| H01L 29/66 | (2006.01) |
| H01L 21/28 | (2006.01) |
| H01L 29/423 | (2006.01) |

(52) U.S. Cl.
CPC .. *H01L 27/11582* (2013.01); *H01L 21/28282* (2013.01); *H01L 29/4234* (2013.01); *H01L 29/66833* (2013.01); *H01L 29/7926* (2013.01)

(58) Field of Classification Search
CPC ......... H01L 27/11582; H01L 21/28282; H01L 29/4234; H01L 29/66833; H01L 29/7926; H01L 27/1157; H01L 27/11524; H01L 27/11519; H01L 29/408; H01L 29/66825
USPC ........ 257/215, 225, 242, 296, 324; 438/176, 438/216, 287, 266
See application file for complete search history.

(56) References Cited

U.S. PATENT DOCUMENTS

2008/0303066 A1* 12/2008 Yonemochi ....... H01L 27/11519
257/208
2016/0351582 A1* 12/2016 Kim .................... H01L 27/1157

* cited by examiner

*Primary Examiner* — Shahed Ahmed
(74) *Attorney, Agent, or Firm* — Wells St. John P.S.

(57) ABSTRACT

Some embodiments include an integrated structure having a vertical stack of alternating insulative levels and conductive levels. The conductive levels include primary regions of a first vertical thickness, and terminal projections of a second vertical thickness which is greater than the first vertical thickness. Charge-blocking material is adjacent the terminal projections. Charge-storage material is adjacent the charge-blocking material. Gate-dielectric material is adjacent the charge-storage material. Channel material is adjacent the gate-dielectric material. Some embodiments include NAND memory arrays. Some embodiments include methods of forming integrated structures.

21 Claims, 10 Drawing Sheets

INTEGRATED STRUCTURES AND NAND MEMORY ARRAYS

TECHNICAL FIELD

Integrated structures, NAND memory arrays, and methods of forming integrated structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

DETAILED DESCRIPTION OF THE ILLUSTRATED EMBODIMENTS

Some embodiments include three-dimensional NAND arrangements having vertically-stacked wordlines extending to vertically-stacked control gate structures of vertically-stacked memory cells. A channel material extends vertically along the memory cells. The control gate structures have vertical thicknesses which are greater than vertical thicknesses of the wordlines. Such may enable the control gate structures to influence a larger proportion of the channel material than is achieved with conventional control gate structures having about the same thickness as the wordlines, and such may reduce resistance along the channel material as compared to conventional configurations. Some embodiments include methods of fabricating three-dimensional NAND configurations having control gate structures with vertical thicknesses greater than vertical thicknesses of wordlines. Example embodiments are described with reference to FIGS. 1-10.

Figure 1:
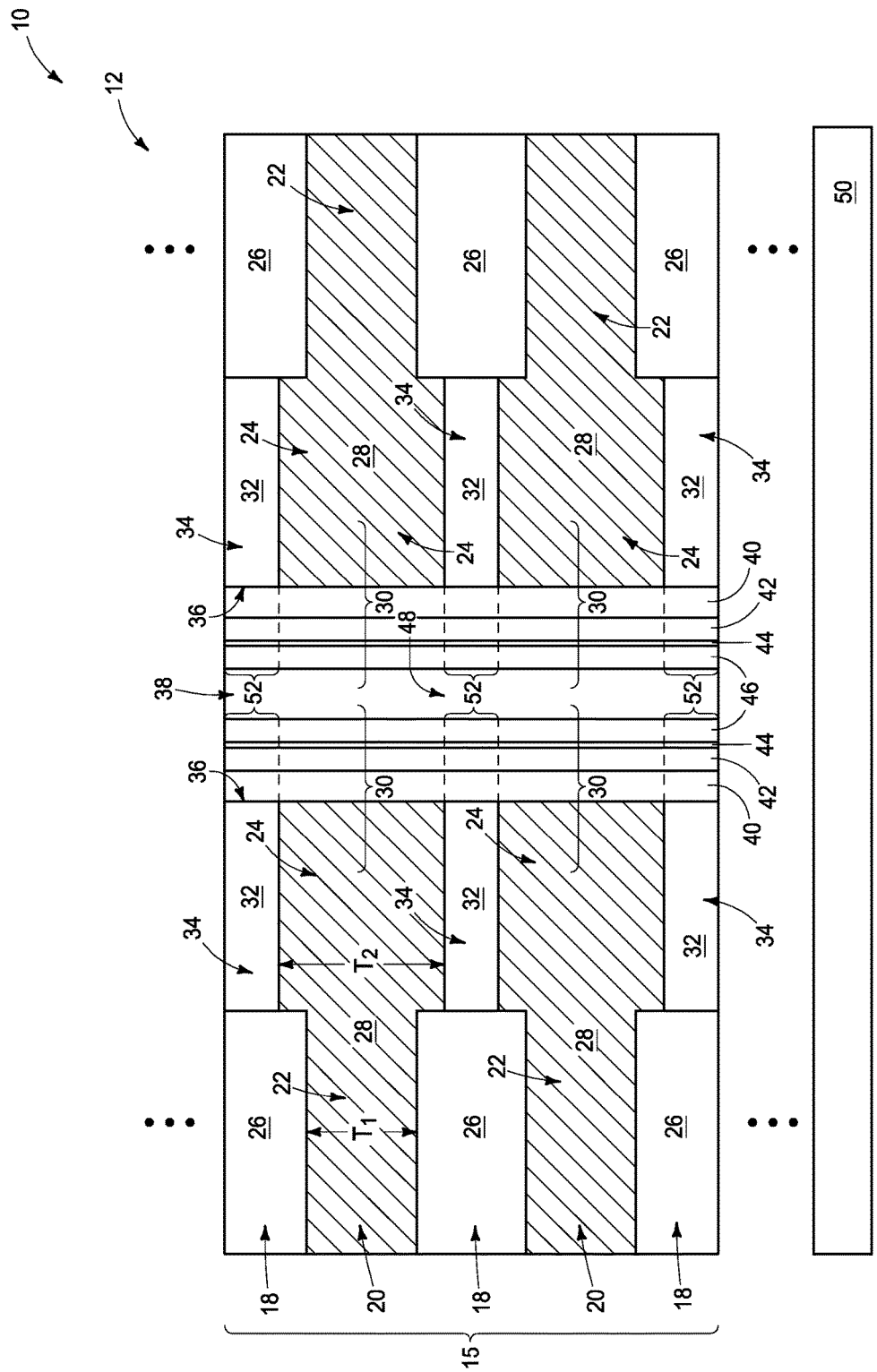
FIG. 1 is a diagrammatic cross-sectional side view of an example integrated structure having a region of an example NAND memory array.

Referring to FIG. 1, a portion of an integrated structure 10 is illustrated, with such portion being a fragment of a three-dimensional NAND memory array 12.

The integrated structure 10 comprises a stack 15 of alternating first and second levels 18 and 20. The levels 18 are insulative (i.e. dielectric), and the levels 20 are conductive.

The insulative levels 18 comprise insulative material 26. Such insulative material may comprise any suitable composition or combination of compositions; and may, for example, comprise silicon dioxide.

The conductive levels 20 comprise conductive material 28. Such conductive material may comprise any suitable composition or combination of compositions; and may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive material 28 may comprise metal (e.g., tungsten) surrounded by metal nitride (e.g., titanium nitride).

The conductive levels 20 have primary regions 22 having a first vertical thickness $T_1$, and have terminal projections 24 having a second vertical thickness $T_2$. The second vertical thickness $T_2$ is greater than the first vertical thickness $T_1$. For instance, in some embodiments the second vertical thickness may be greater than the first vertical thickness by an amount within a range of from about 10% to about 70%; by an amount within a range of from about 20% to about 50%; by an amount of at least about 10%, at least about 30%, at least about 50%, at least about 70%, at least about 100%, etc.

In some embodiments, the primary regions 22 may be referred to as wordline regions of the conductive levels 20, and the terminal projections 24 may be referred to as control gate regions of the conductive levels 20. The description of the primary regions 22 as wordline regions and the terminal projections 24 as control gate regions is an approximate description, and it is to be understood that in some embodiments only a portion of the terminal projections 24 may function as control gates of memory cells, in other embodiments the entirety of the terminal projections 24 may function as control gates of memory cells, and in some embodiments portions of the primary regions 22 immediately adjacent the terminal projections 24 may also be incorporated into the functional control gates of the memory cells.

The primary regions 22 of conductive levels 20 may be of any suitable vertical thicknesses, and the insulative levels 18 may also be of any suitable vertical thicknesses. In some embodiments, the primary regions 22 of conductive levels 20 may have vertical thicknesses within a range of from about 10 nm to about 300 nm. In some embodiments, the insulative levels 18 may have vertical thicknesses within a range of from about 10 nm to about 300 nm. In some embodiments, the primary regions 22 of conductive levels 20 may have about the same vertical thicknesses as the insulative levels 18. In other embodiments, the primary regions 22 of conductive levels 20 may have substantially different vertical thicknesses than the insulative levels 18.

The NAND memory array 12 includes vertically-stacked memory cells 30, with approximate locations of the memory cells 30 being indicated with brackets in FIG. 1. The vertically-stacked memory cells 30 form a vertical string (such as, for example, a vertical NAND string of memory cells), with the number of memory cells in each string being determined by the number of conductive levels 20. The stack 15 may comprise any suitable number of conductive levels. For instance, the stack 15 may have 8 conductive levels, 16 conductive levels, 32 conductive levels, 64 conductive levels, 512 conductive levels, 1028 conductive levels, etc.

The terminal projections 24 are vertically spaced from one another by insulative regions 34, which are shown comprising insulative material 32. The insulative material 32 may comprise any suitable composition or combination of compositions; such as, for example, silicon dioxide, silicon nitride, etc. In some embodiments, the insulative material 32 may comprise a same composition as the insulative material 26, and accordingly the materials 32 and 26 may merge into a common composition across insulative levels 18. In some embodiments, the insulative regions 34 may comprise gas-filled voids, rather than having solid or semisolid insulative material 32 therein.

In the shown embodiment, the insulative material 32 and terminal projections 24 together form vertical sidewalls 36. In some embodiments, the vertical sidewalls 36 may be considered to be sidewalls of an opening 38 extending through stack 15. The opening 38 may have a continuous shape when viewed from above; and may be, for example, circular, elliptical, etc. Accordingly, the sidewalls 36 of FIG. 1 may be comprised by a continuous sidewall that extends around the periphery of opening 38.

Charge-blocking material 40 extends vertically along the sidewalls 36, and is adjacent the conductive terminal projections 24. In the shown embodiment, the vertically-extending charge-blocking material 40 is directly against conductive material of the conductive projections 24. In other embodiments (such as, for example, an embodiment described below with reference to FIG. 2) the vertically-extending charge-blocking material 40 may be spaced from conductive material of terminal projections 40 by one or more intervening materials.

The charge-blocking material 40 forms charge-blocking regions of the memory cells 30. The charge-blocking material 40 may comprise any suitable composition or combination of compositions; including, for example, one or more of silicon dioxide, silicon nitride, and/or one or more of various high-k dielectric materials (with the term "high-k material" meaning a material with a dielectric constant greater than that of silicon dioxide). A charge block may have the following functions in a memory cell: in a program mode, the charge block may prevent charge carriers from passing out of the charge-storage material (e.g., floating-gate material, charge-trapping material, etc.) toward the control gate; and in an erase mode, the charge block may prevent charge carriers from flowing into the charge-storage material from the control gate. A charge-blocking region may comprise any suitable material(s) or structure(s) providing desired charge-blocking properties; and may, for example, comprise: an insulative material between control gate and charge-storage material; an outermost portion of a charge-trapping material where such material is dielectric and independent of where "charge" is stored in such portion; an interface between the control gate and the charge-trapping material, etc.

Charge-storage material 42 extends vertically along the charge-blocking material 40. The charge-storage material 42 may comprise any suitable composition or combination of compositions; and in some embodiments may comprise floating gate material (for instance, doped or undoped silicon) or charge-trapping material (for instance, silicon nitride, metal dots, etc.). In some embodiments, the charge-storage material 42 may comprise, consist essentially of, or consist of silicon nitride. The charge-storage forms charge-storage regions of the memory cells 30. In some aspects, a "charge trap" refers to an energy well that can reversibly capture a charge carrier (e.g., an electron or hole).

Gate-dielectric material 44 extends vertically along the charge-storage material 42. The gate-dielectric material 44 may comprise any suitable composition or combination of compositions; and in some embodiments may comprise, consist essentially of, or consist of silicon dioxide. The gate-dielectric material 44 forms gate dielectric regions of memory cells 30. The gate-dielectric material can function as a material through which charge carriers tunnel or otherwise pass during programming operations, erasing operations, etc. In some contexts, the gate-dielectric material may be referred to simply as an insulative material or a dielectric material.

Channel material 46 extends vertically along the gate-dielectric material 44. The channel material 46 may comprise any suitable composition or combination of compositions; and in some embodiments may comprise, consist essentially of, or consist of appropriately-doped silicon.

In the illustrated embodiment, an insulative region 48 extends along a middle of opening 38. The insulative region 48 may comprise any suitable insulative composition; including, for example, silicon dioxide, silicon nitride, etc. Alternatively, at least a portion of the insulative region 48 may be a gas-filled void. The illustrated embodiment having the insulative region 48 extending down the middle of opening 38 is a so-called hollow-channel configuration. In other embodiments, the channel material 46 may entirely fill the central region of opening 38 to form a vertically-extending pedestal within such central region.

The stack 15 is supported by a base 50. A break is provided between the base 50 and the stack 15 to indicate that there may be additional materials and/or integrated circuit structures between the base 50 and the stack 15. In some applications, such additional materials may include, for example, source-side select gate material (SGS material).

The base 50 may comprise semiconductor material; and may, for example, comprise, consist essentially of, or consist of monocrystalline silicon. The base 50 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 50 may correspond to a semiconductor substrate containing one or more materials associated with integrated circuit fabrication. Such materials may include, for example, one or more of refractory metal materials, barrier materials, diffusion materials, insulator materials, etc.

During operation of the NAND memory array 12, current flows vertically along the channel material 46. It is desired to have relatively low resistance throughout the channel material 46 in order to reduce power needs and otherwise improve operation across the NAND memory array. An advantage of the configuration of FIG. 1 is that the majority of the channel material 46 is under the influence of control gates within terminal projections 24. Specifically, only portions of channel material 46 within the narrow gap regions 52 may be too distant from the conductive material of terminal projections 24 to be directly influenced by control gates within the terminal projections 24. However, if the gap regions 52 are narrow enough, it may be that all of the channel material 46 is influenced by the control gates within terminal projections 24 (and in such embodiments, the gap regions 52 may be analogous to lightly-doped diffusion (Ldd) regions). Regardless, the wide terminal projections 24 of the embodiment of FIG. 1 may enable a much larger proportion of the channel material 46 to be influenced by operation of vertically-stacked control gates as compared with conventional three-dimensional NAND configurations. Specifically, conventional three-dimensional NAND configurations may have conductive levels analogous to the conductive levels 20 of FIG. 1, but with a uniform thickness across wordline regions of the conductive levels and control gate regions of the conductive levels. In other words, the conventional three-dimensional NAND configurations lack the wide terminal projections 24 shown in the embodiment of FIG. 1, and accordingly may have much wider gap regions 52 then those of the embodiment of FIG. 1. The wider gap regions 52 of conventional three-dimensional NAND configurations may lead to higher resistance along the channel material 46 within the conventional three-dimensional NAND configurations as compared with the example embodiment configuration of FIG. 1.

Figure 2:
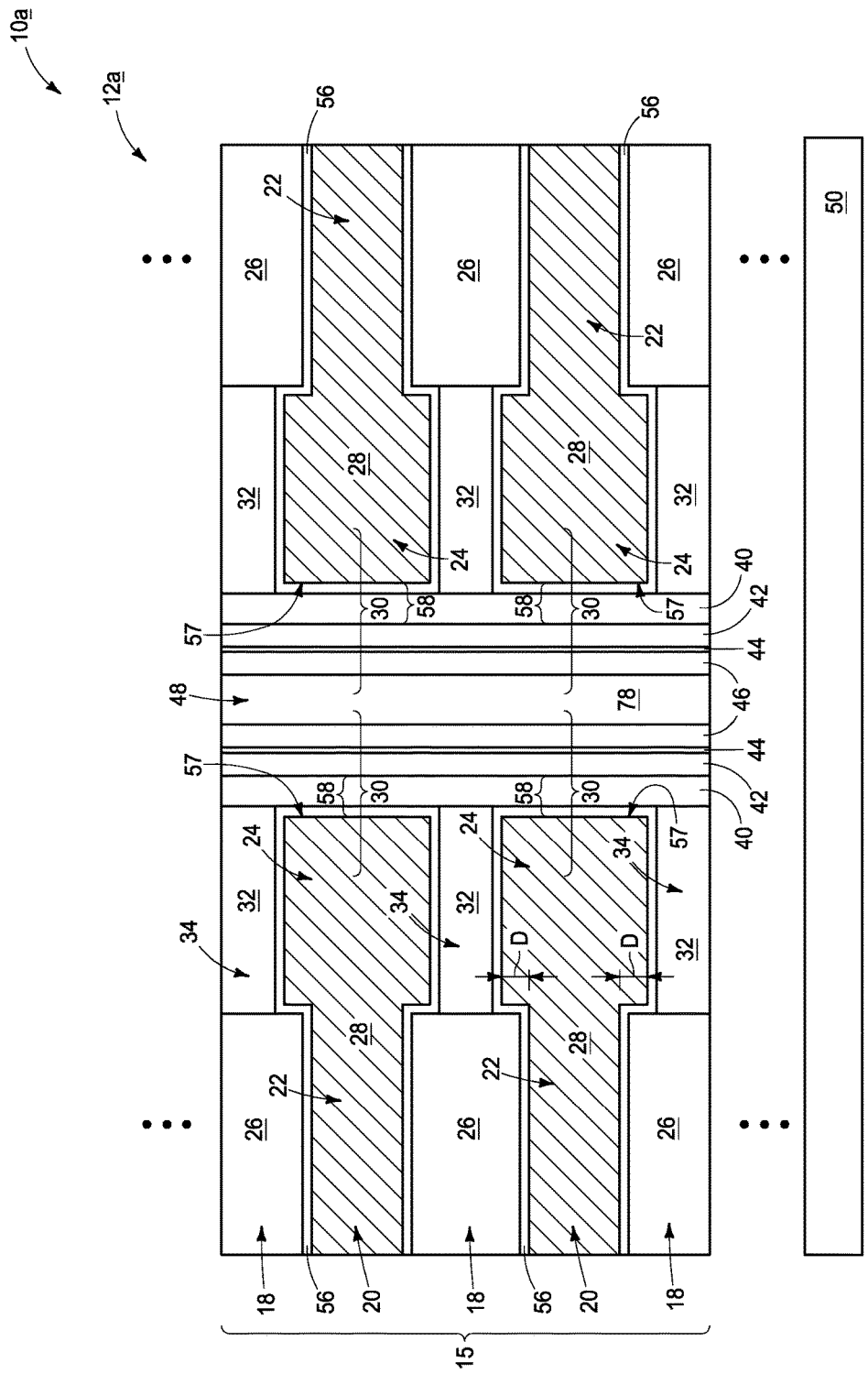
FIG. 2 is a diagrammatic cross-sectional side view of another example integrated structure having a region of another example NAND memory array.

FIG. 2 shows a construction 10a having a NAND memory array 12a illustrating another example configuration. The configuration of FIG. 2 is similar to that of FIG. 1, except that the conductive material 28 of conductive levels 20 is surrounded by insulative material 56. The insulative material 56 may comprise any suitable composition or combination of compositions. In some embodiments, the insulative material 56 may comprise high-k dielectric material (for instance, aluminum oxide). Regions of such high-k dielectric material 56 between the terminal projections 24 and the channel material 46 (i.e., regions of the high-k dielectric material 56 vertically along outer edges 57 of the terminal projections 24) may be incorporated into charge-blocking regions 58 of memory cells 30. Specifically, such charge-blocking regions 58 may include regions of the charge-blocking material 40 in combination with regions of the high-k dielectric material 56.

Although the conductive material 28 is shown to be a homogeneous composition in the embodiment of FIGS. 1 and 2, it is to be understood that the conductive material 28 may comprise two or more different conductive compositions. For instance, in some embodiments the conductive material 28 may comprise a conductive core material (for instance, a metal; such as tungsten, titanium, etc.), and an outer conductive layer (for instance, metal nitride; such as titanium nitride, tungsten nitride, etc.) around the conductive core material, as shown and described below with reference to FIG. 10.

In the example embodiments of FIGS. 1 and 2, the primary conductive regions 22 of conductive levels 20 are approximately vertically-centered relative to the terminal projections 24 of the conductive levels 20. Such is diagrammatically illustrated with reference to the conductive level 20 at the bottom left of FIG. 2 by showing that the terminal projection 24 extends an equal distance "D" above and below the primary conductive region 22. In other embodiments, the primary conductive regions 22 may be vertically offset relative to the conductive projections 24 so that they are not vertically-centered relative to such terminal projections.

The three-dimensional NAND configurations of FIGS. 1 and 2 may be fabricated utilizing any suitable methodology. Example methodology is described with reference to FIGS. 3-10.

Figure 3:
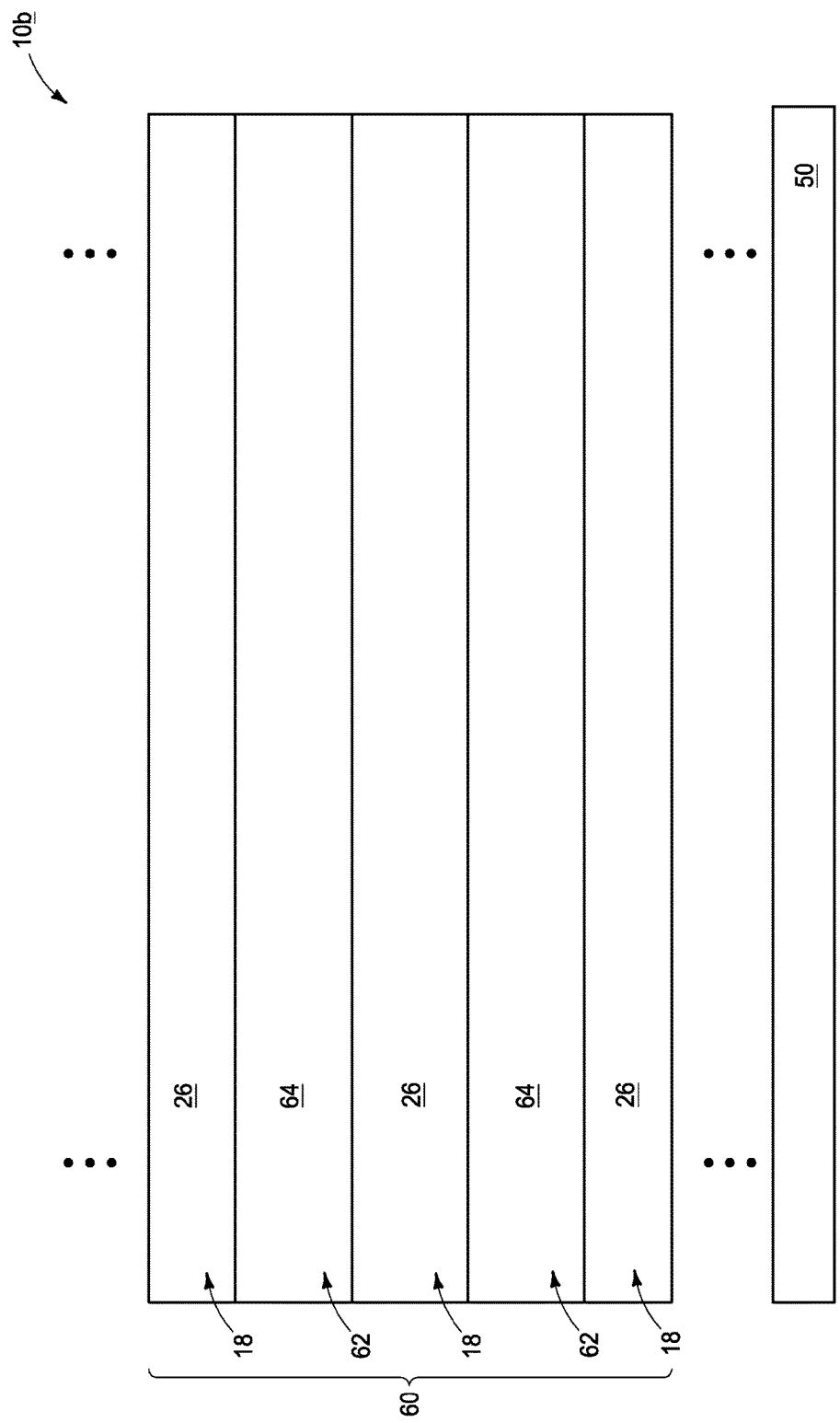
FIGS. 3-10 are diagrammatic cross-sectional side views of an example integrated structure at process stages of an example method.

Referring to FIG. 3, a construction 10b includes a vertical stack 60 of alternating first levels 18 and second levels 62 over the base 50. The first levels 18 comprise the first material 26 described above with reference to FIG. 1. The second levels 62 comprise second material 64, which is a sacrificial (i.e., replaceable) material. The second material 64 may comprise any suitable composition or combination of compositions; such as, for example, silicon nitride, etc.

Figure 4:
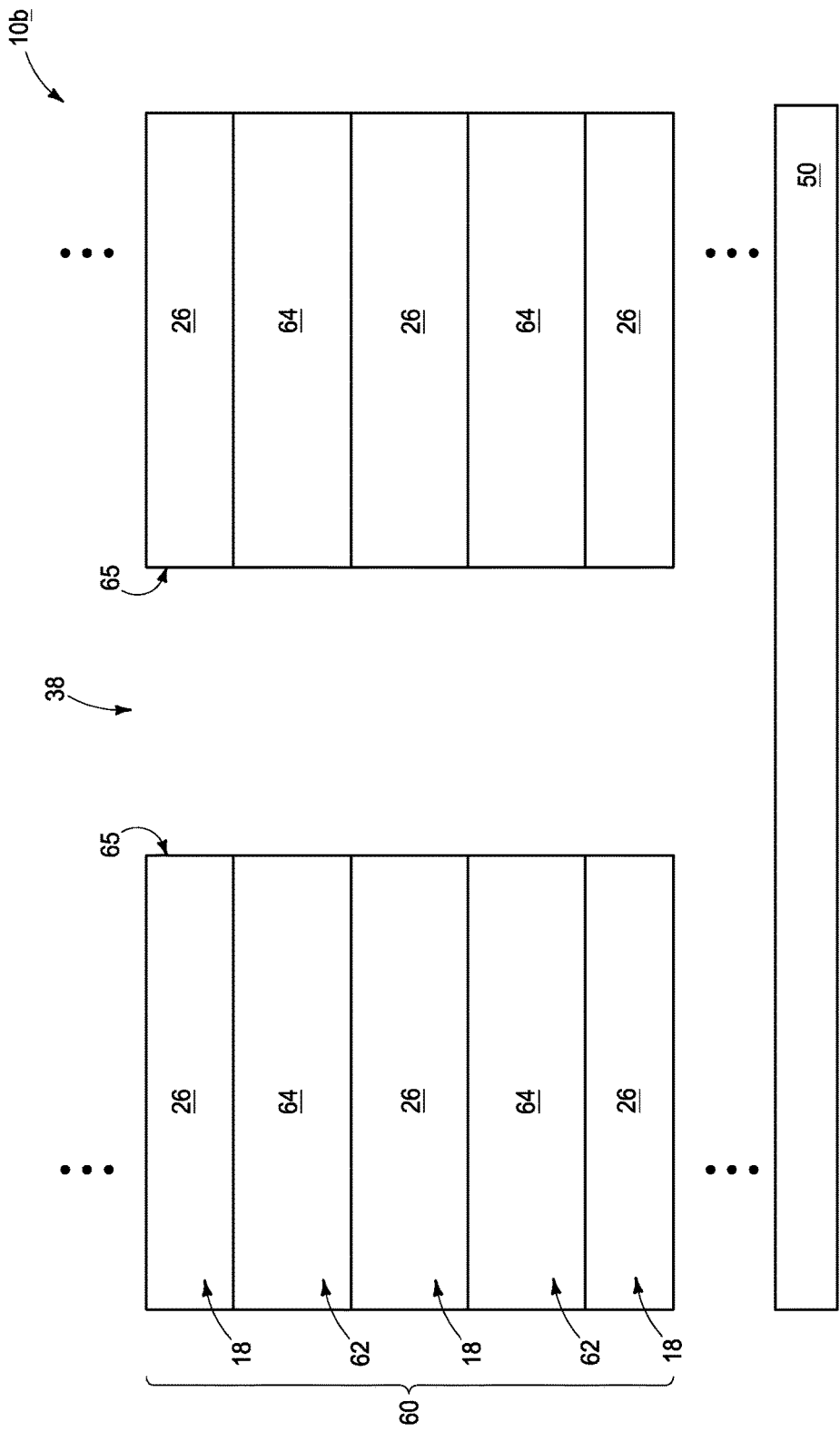

Referring to FIG. 4, the opening 38 is formed to extend through stack 60. The opening 38 may be formed utilizing any suitable methodology. For instance, a patterned mask (not shown) may be formed over the stack 60 to define a location of the opening 38, and then the opening 38 may be formed to extend through the stack 60 with one or more suitable etches. Subsequently, the patterned mask may be removed.

The opening 38 has vertical sidewalls 65 extending along the first and second materials 26 and 64.

Figure 5:
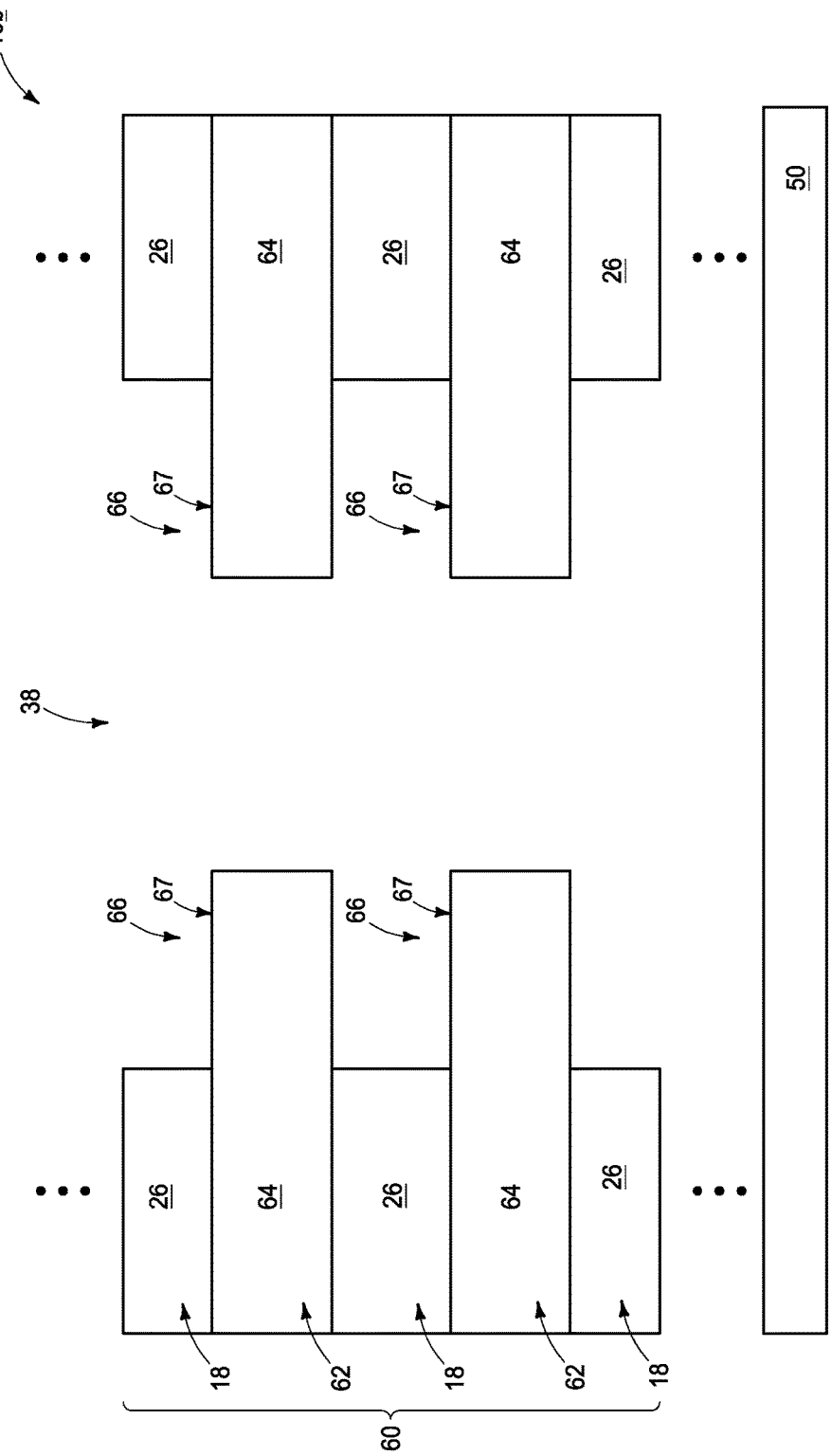

Referring to FIG. 5, the first levels 18 are recessed relative to the second levels 62. Such recessing may be accomplished utilizing any suitable etch selective for the first material 26 relative to the second material 64. After the first levels 18 are recessed, the second levels 62 have projecting terminal ends 66 which extend outwardly beyond the recessed first levels 18. The projecting terminal ends 66 have exposed surfaces 67 of the second material 64.

Figure 6:
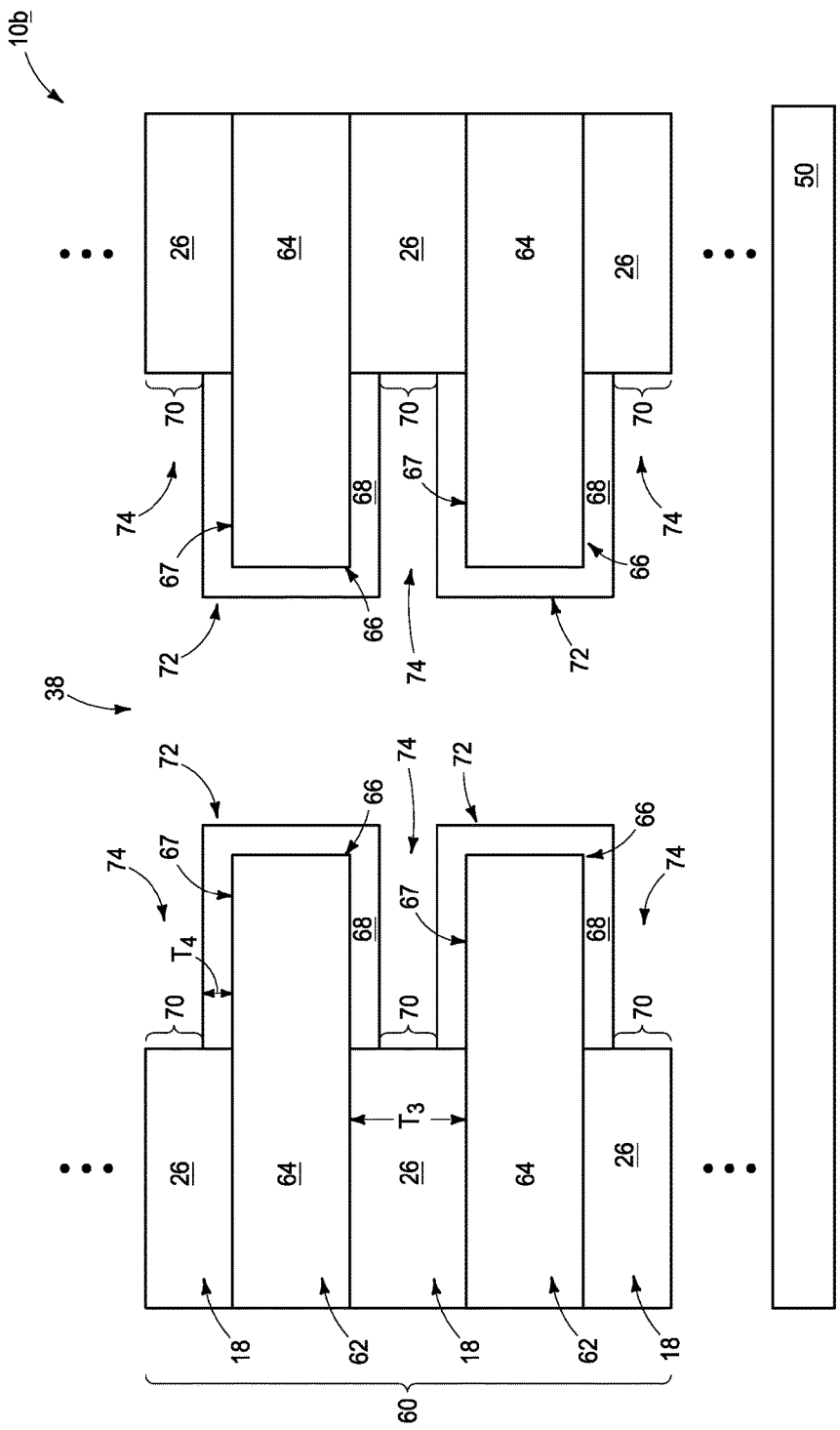

Referring to FIG. 6, third material 68 is formed along the exposed surfaces 67 of the second material 64. The third material 68 is selectively formed along surfaces of the second material 64 relative to surfaces of the first material 26. The third material 68 only partially overlaps the first material 26 to leave regions 70 of the first material 26 exposed. In some embodiments, the material 68 together with the projections 66 of material 64 may be considered to form wide terminal projections 72, and the exposed regions 70 of first material 26 may be considered to be within the gaps 74 between the wide terminal projections 72.

The third material 68 may comprise any suitable composition or combination of compositions. The third material 68 may comprise a same composition as the second material 64, or may comprise a different composition than the second material 64. In some embodiments, the second material 64 and the third material 68 both comprise, consist essentially of, or consist of silicon nitride.

The first vertical levels 18 and may be considered to comprise a vertical thickness $T_3$, and the third material 68 may be considered to be formed to a thickness $T_4$. In some embodiments, the thickness $T_4$ of the third material 68 may be less than or equal to about one-third of the vertical thickness $T_3$ of the first vertical levels 18.

Figure 7:
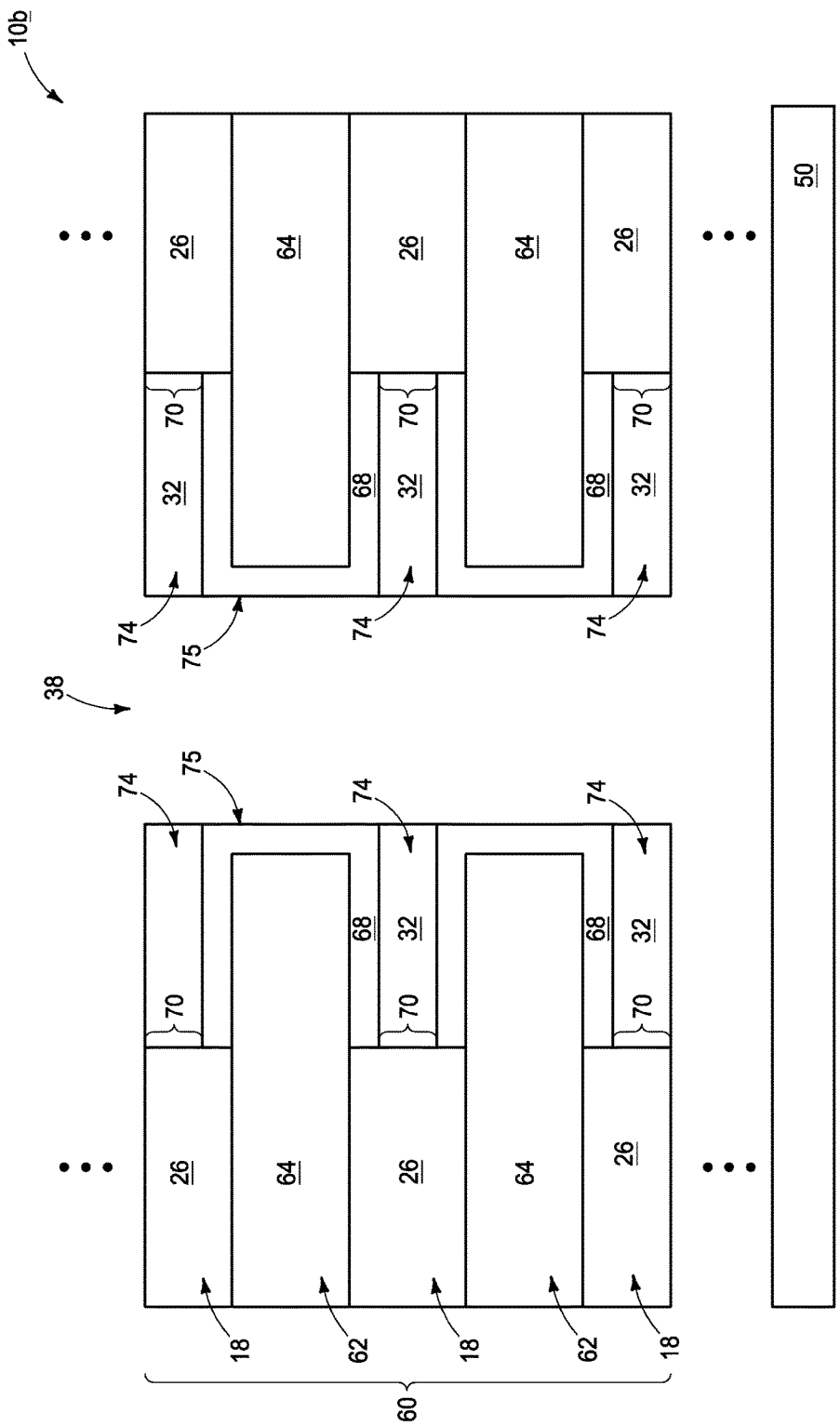

Referring to FIG. 7, fourth material 32 is formed within the gaps 74 and along the exposed regions 70 of the first material 26. The fourth material 32 may comprise any suitable composition; such as, for example, the compositions described above with reference to FIG. 1.

The third and fourth materials 68/32 have outer surfaces that form vertical edges 75 along sidewalls of opening 38.

Figure 8:
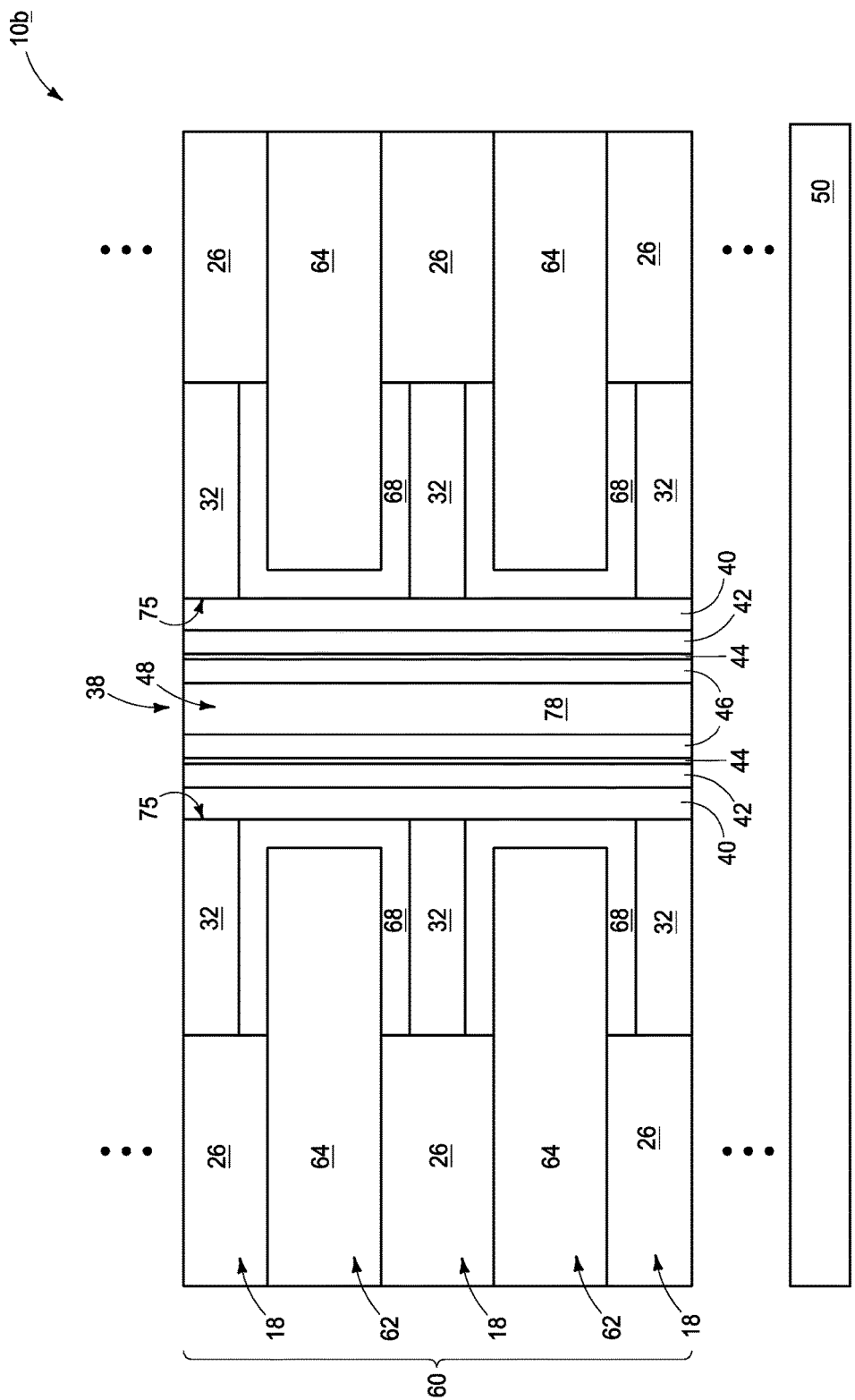

Referring to FIG. 8, charge-blocking material 40 is formed along the vertical edges 75 of opening 38, charge-storage material 42 is formed to extend vertically along the charge-blocking material 40, gate-dielectric material 44 is formed to extend vertically along the charge-storage material 42, and channel material 46 is formed to extend vertically along the gate-dielectric material 44. Insulative material 78 is then formed within a remaining central region of opening 38. The insulative material 78 forms the insulative region 48 described above with reference to FIG. 1; and may comprise any suitable composition or combination of compositions (such as, for example, silicon nitride, silicon dioxide, etc.). In some embodiments, the insulative material 78 may be omitted and a void may be left within the central region of opening 38. Alternatively, channel material 46 may be formed to entirely fill the opening 38.

Figure 9:
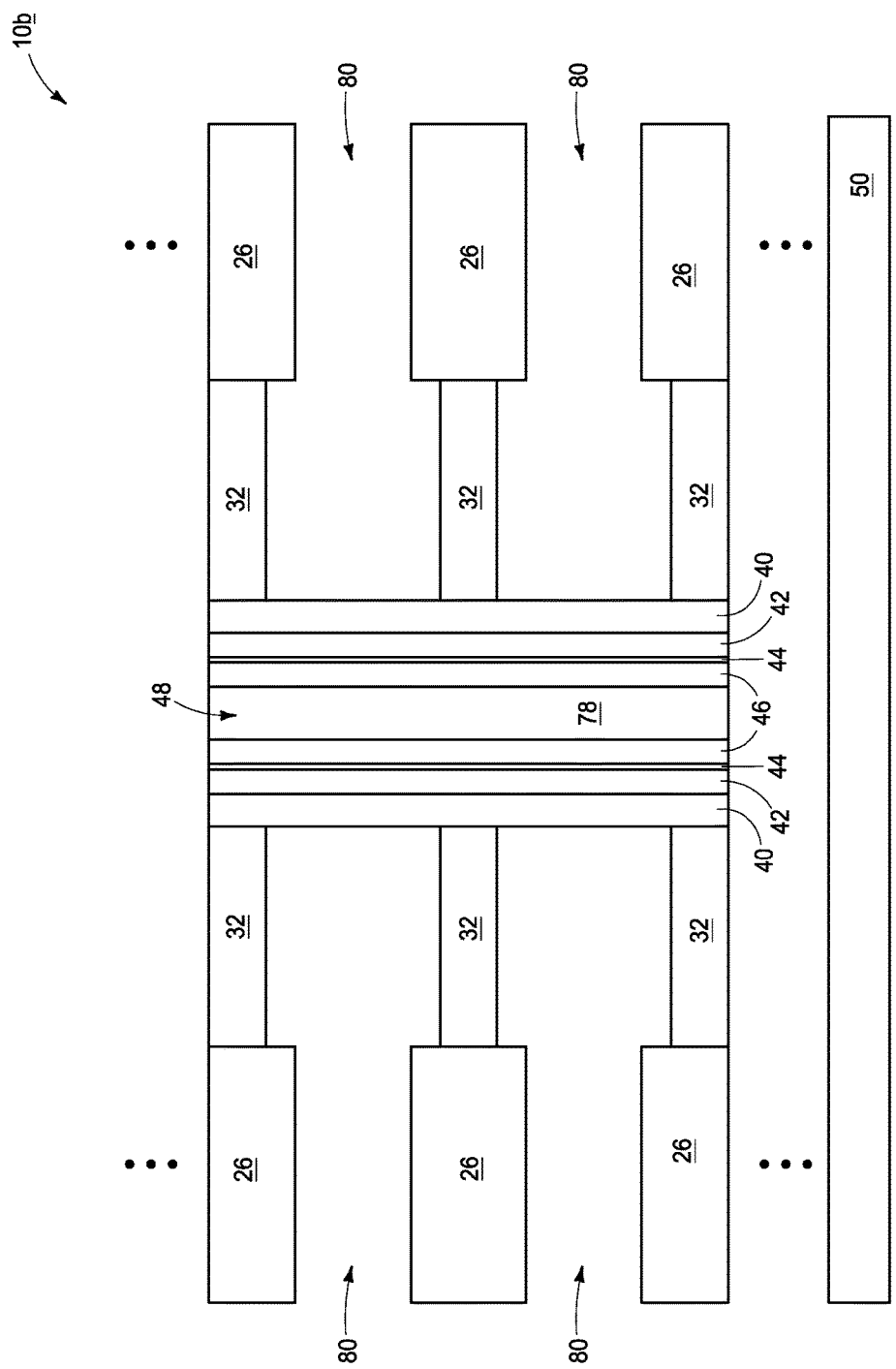

Referring to FIG. 9, the second and third materials 64/68 (FIG. 8) are removed to leave voids 80. Such removal may be accomplished with any suitable etch which is selective for the second and third materials 64/68 relative to the first and fourth materials 26/32. In some embodiments, materials 26/32 comprise, consist essentially of, or consist of silicon dioxide, and materials 64/68 comprise, consist essentially of, or consist of silicon nitride. In such embodiments, materials 64/68 may be removed with an etch selective for the silicon nitride relative to the silicon dioxide.

Figure 10:
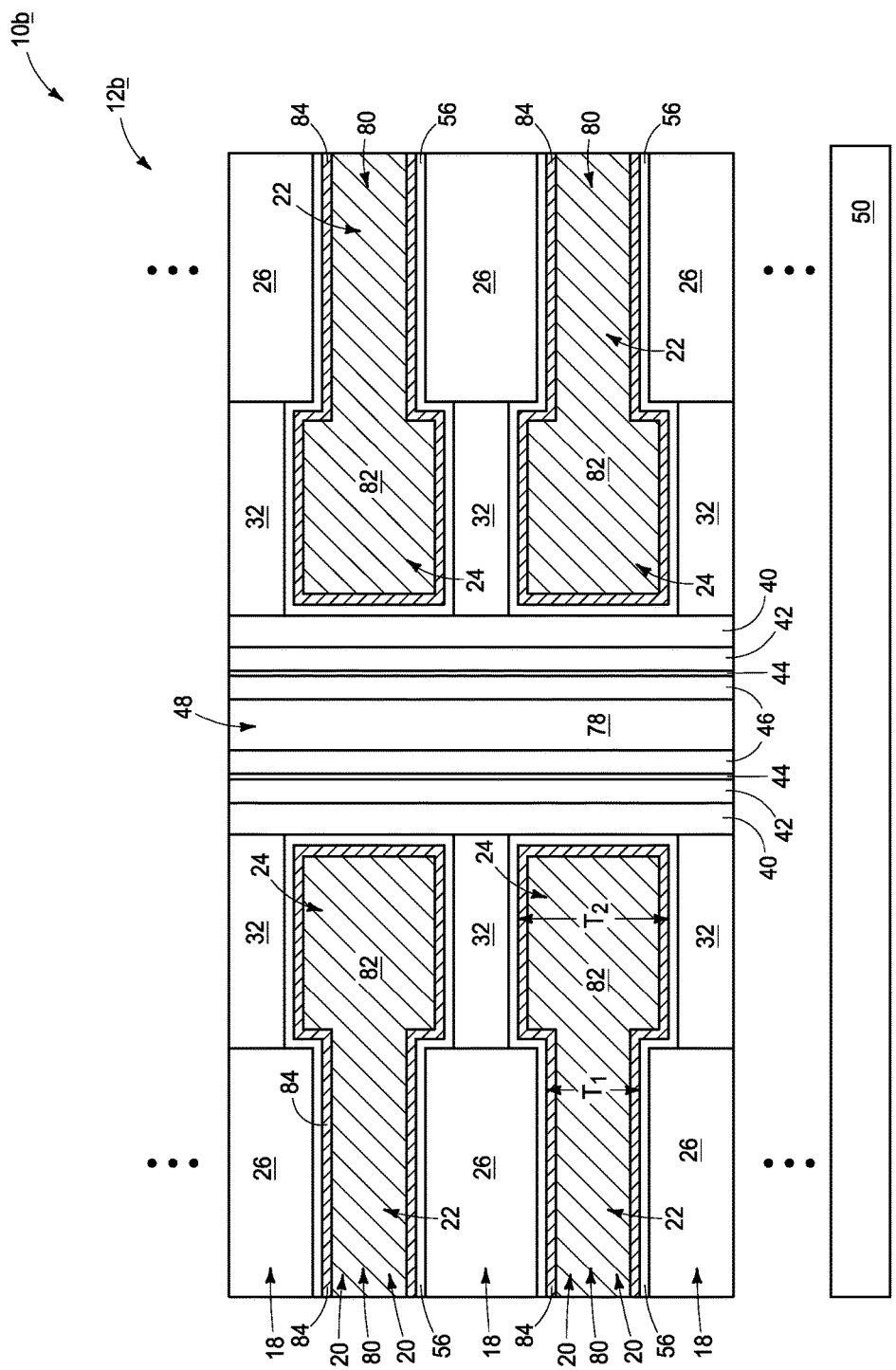

Referring to FIG. 10, insulative material 56 is formed within voids 80 to line the voids, and thereby become an insulative liner within the voids. The insulative material 56 may comprise high-k material (for instance, aluminum oxide) as discussed above with reference to FIG. 2.

Conductive materials 82 and 84 are formed within the voids 80. The conductive material 82 may be considered to be a conductive core, and the conductive material 84 may be considered to be an outer conductive layer surrounding the conductive core. The conductive materials 82 and 84 may comprise different compositions relative to one another. In some embodiments, the conductive material 82 may comprise, consist essentially of, or consist of one or more metals (for instance, tungsten, titanium, etc.), and the surrounding conductive material 84 may comprise, consist essentially of, or consist of one or more metal-containing compositions (for instance, metal nitride, metal silicide, metal carbide, etc.).

The conductive materials 82 and 84 together form conductive levels 20. Such conductive levels have primary regions 22 of the first vertical thickness $T_1$, and have terminal projections 24 of the second vertical thickness $T_2$; where the second vertical thickness $T_2$ is greater than the first vertical thickness $T_1$. Accordingly, the construction 10b of FIG. 10 comprises a three-dimensional NAND memory array 12b analogous to the NAND memory arrays 12 and 12a of FIGS. 1 and 2.

The structures described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels include primary regions of a first vertical thickness, and terminal projections of a second vertical thickness which is greater than the first vertical thickness. Charge-blocking material is adjacent the terminal projections. Charge-storage material is adjacent the charge-blocking material. Gate-dielectric material is adjacent the charge-storage material. Channel material is adjacent the gate-dielectric material.

Some embodiments include a NAND memory array which includes a vertical stack of alternating insulative levels and wordline levels. The wordline levels have primary regions of a first vertical thickness, and have terminal projections of a second vertical thickness which is greater than the first vertical thickness. The terminal projections include control gate regions. A charge-blocking region extends vertically along the vertical stack, and is adjacent the control gate regions. A charge-storage region extends vertically along the charge-blocking region. Gate-dielectric material extends vertically along the charge-storage region. Channel material extends vertically along the gate-dielectric material.

Some embodiments include a method of forming an integrated structure. A vertical stack of alternating first and second levels is formed. The first levels comprise insulative first material, and the second levels comprising second material. The first levels are recessed relative to the second levels. The second levels have projecting terminal ends extending beyond the recessed first levels. The projecting terminal ends have exposed surfaces of the second material. Third material is formed along the exposed surfaces of the second material and around the terminal ends of the second levels. The third material only partially overlaps the first level to leave regions of insulative first material of the first levels exposed. Fourth material is formed along the exposed regions of the insulative first material. The third and fourth materials have outer surfaces that form a vertical edge. Charge-blocking material is formed to extend vertically along the vertical edge. Charge-storage material is formed to extend vertically along the charge-blocking material. Gate-dielectric material is formed to extend vertically along the charge-storage material. Channel material is formed to extend vertically along the gate-dielectric material. The second and third materials are removed to leave voids. Conductive levels are formed within the voids. The conductive levels have primary regions of a first vertical thickness, and have terminal projections of a second vertical thickness which is greater than the first vertical thickness.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
a vertical stack of alternating insulative levels and conductive levels;
the conductive levels having primary regions of a first vertical thickness, and having terminal projections of a second vertical thickness which is greater than the first vertical thickness;
charge-blocking material adjacent the terminal projections;
charge-storage material adjacent the charge-blocking material;
gate-dielectric material adjacent the charge-storage material;
channel material adjacent the gate-dielectric material;
wherein each of the terminal projections has a front lateral edge extending along the charge-blocking material, an upper horizontal edge extending back from the front lateral edge, and a lower horizontal edge extending back from the front lateral edge; the front lateral edge having a length along a vertical direction, and the upper and lower horizontal edges having lengths along a horizontal direction;
wherein the upper horizontal edge joins to the front lateral edge at a first right angle;
wherein the lower horizontal edge joins to the front lateral edge at a second right angle;
wherein the upper horizontal edge is longer than the front lateral edge; and
wherein the lower horizontal edge is longer than the front lateral edge.

2. The integrated structure of claim 1 wherein the second vertical thickness is greater than the first vertical thickness by an amount within a range of from about 10% to about 70%.

3. The integrated structure of claim 1 wherein each conductive level has the primary region approximately vertically centered relative to the terminal projection.

4. The integrated structure of claim 1 wherein each conductive level comprises a conductive core surrounded by an outer conductive layer; with the conductive core comprising a different composition than the outer conductive layer.

5. The integrated structure of claim 4 wherein the conductive cores comprise one or more metals; and wherein the outer conductive layers comprise metal nitride.

6. The integrated structure of claim 4 wherein the conductive cores comprise tungsten; and wherein the outer conductive layers comprise titanium nitride.

7. The integrated structure of claim 4 further comprising an insulative material surrounding the outer conductive layer of each conductive level.

8. The integrated structure of claim 7 wherein the insulative material is a high-k material.

9. The integrated structure of claim 7 wherein the insulative material comprises aluminum oxide.

10. A NAND memory array, comprising:
a vertical stack of alternating insulative levels and wordline levels;
the wordline levels having primary regions of a first vertical thickness, and having terminal projections of a second vertical thickness which is greater than the first vertical thickness; the terminal projections including control gate regions;
a charge-blocking region extending vertically along the vertical stack, and being adjacent the control gate regions;
a charge-storage region extending vertically along the charge-blocking region;
gate-dielectric material extending vertically along the charge-storage region;
channel material extending vertically along the gate-dielectric material;
wherein each of the terminal projections has a front lateral edge extending along the charge-blocking region, an upper horizontal edge extending back from the front lateral edge, and a lower horizontal edge extending back from the front lateral edge; the front lateral edge having a length along a vertical direction, and the upper and lower horizontal edges having lengths along a horizontal direction;
wherein the upper horizontal edge is longer than the front lateral edge; and
wherein the lower horizontal edge is longer than the front lateral edge.

11. The NAND memory array of claim 1 wherein the upper horizontal edge is generally parallel to the lower horizontal edge.

12. The NAND memory array of claim 1 wherein each of the primary regions has an upper horizontal edge that is generally parallel to the upper horizontal edges of the terminal projections.

13. The NAND memory array of claim 10 wherein the second vertical thickness is greater than the first vertical thickness by an amount within a range of from about 10% to about 70%.

14. The NAND memory array of claim 10 wherein each wordline level comprises a conductive core surrounded by an outer conductive layer; with the conductive core comprising a different composition than the outer conductive layer; and wherein each wordline level comprises an insulative material surrounding the outer conductive layer.

15. The NAND memory array of claim 14 wherein the conductive cores comprise one or more metals, wherein the outer conductive layers comprise metal nitride and wherein the insulative material is a high-k material.

16. The NAND memory array of claim 14 wherein the conductive cores comprise tungsten; wherein the outer conductive layers comprise titanium nitride, and wherein the insulative material comprises aluminum oxide.

17. The NAND memory array of claim 10 wherein the charge-storage region comprises charge-trapping material.

18. The NAND memory array of claim 17 wherein the charge-storage region comprises silicon nitride.

19. The NAND memory array of claim 10 wherein the upper horizontal edge joins to the front lateral edge at a first right angle; and wherein the lower horizontal edge joins to the front lateral edge at a second right angle.

20. The NAND memory array of claim 10 wherein the upper horizontal edge is generally parallel to the lower horizontal edge.

21. The NAND memory array of claim 10 wherein each of the primary regions has an upper horizontal edge that is generally parallel to the upper horizontal edges of the terminal projections.

* * * * *